(12) United States Patent
Ry et al.

(10) Patent No.: US 7,751,486 B2
(45) Date of Patent: Jul. 6, 2010

(54) SYSTEMS AND METHODS FOR TRANSMITTING DATA

(75) Inventors: Hans Westgaard Ry, Ry (NO); Steffen Persvold, Shrewsbury, MA (US); Hakon Bugge, Oslo (NO)

(73) Assignee: Platform Computing Corporation, Markham, Ontario (CA)

( * ) Notice: Subject to any disclaimer, the term of this patent is extended or adjusted under 35 U.S.C. 154(b) by 823 days.

(21) Appl. No.: 11/437,902

(22) Filed: May 19, 2006

(65) Prior Publication Data

US 2007/0268985 A1 Nov. 22, 2007

(51) Int. Cl.
*H04B 14/04* (2006.01)
(52) U.S. Cl. .................................. 375/253; 375/242
(58) Field of Classification Search ................ 375/219, 375/220, 222, 242, 246, 253; 341/143
See application file for complete search history.

(56) References Cited

U.S. PATENT DOCUMENTS

| | | | |
|---|---|---|---|
| 4,077,028 A | 2/1978 | Lui et al. | |
| 4,377,862 A | 3/1983 | Koford et al. | |
| 5,022,051 A | 6/1991 | Crandall et al. | |
| 5,111,457 A | 5/1992 | Rabjohns et al. | |
| 5,150,430 A * | 9/1992 | Chu | 382/246 |
| 5,438,621 A | 8/1995 | Hornak et al. | |
| 5,502,728 A | 3/1996 | Smith, III | |
| 5,515,380 A | 5/1996 | Giger | |
| 5,694,407 A | 12/1997 | Glaise | |
| 5,842,902 A | 12/1998 | Liff | |
| 6,002,973 A * | 12/1999 | Giegold | 701/35 |
| 6,453,440 B1 | 9/2002 | Cypher | |
| 7,321,322 B2 * | 1/2008 | Helfman et al. | 341/87 |
| 2001/0013838 A1 | 8/2001 | Shin et al. | |
| 2003/0070042 A1 | 4/2003 | Byrd et al. | |
| 2003/0091056 A1 | 5/2003 | Paul Hulme Walker et al. | |
| 2004/0098655 A1 | 5/2004 | Sharma | |
| 2004/0117723 A1 | 6/2004 | Foss | |
| 2005/0097361 A1 | 5/2005 | Apostolopoulos et al. | |

FOREIGN PATENT DOCUMENTS

| | | |
|---|---|---|
| EP | 1 130 512 A | 9/2001 |
| JP | 62 213333 A | 9/1987 |
| WO | WO-2005/043389 A | 5/2005 |

OTHER PUBLICATIONS

Duan et al., "Analysis and Avoidance of Cross-talk in On-Chip Buses," *Proc. of Symposium on High Performance Interconnects*, 133-138 (2001).
Stan et al., "Bus-Invert Coding for Low-Power I/O," *IEEE Transactions on Very Large Scale Integration (VLSI) Systems*, 3:49-58 (1995).

* cited by examiner

*Primary Examiner*—Young T. Tse
(74) *Attorney, Agent, or Firm*—Baker & McKenzie LLP (57) ABSTRACT

Presented herein are systems, methods, and devices for transmitting data comprising by comparing a new message with a buffered message representative of a previous message, recording an integer number of differences between the new message and the buffered message, generating a diff-word representative of the integer number of differences between the new message and the buffered message, appending the diff-word to the new message, and sending the new message with the diff-word to a receiver. The diff-word is used by the receiver to determine whether a received new message has the expected number of differences, and to determine whether to accept the new message.

32 Claims, 6 Drawing Sheets

SYSTEMS AND METHODS FOR TRANSMITTING DATA

BACKGROUND

Data transmission in communication systems involves sending information over a data channel or pathway. Digital data is represented as a stream of bits or bytes, which may be sent from one location to another. As the data is sent from one location to another, the receiver might observe partially received message fragments and/or parts of the message delivered out-of-order with respect to each other. Current methods used to check data integrity include several steps. First the sender initiates message transmission. Next, the sender ensures that the message meets standards of global consistency. Then, the sender notifies the receiver that a message has been sent by, for example, sending an interrupt or increasing a counter. Other methods include Hamming codes, forward error correction, and Trellis codes. These methods are resource-intensive, requiring high amounts of encoder power that result in slower data transmission rates, and are therefore expensive to implement. Accordingly, there is a need for enhanced data communications supporting higher data transmission rates without sacrificing processing power and costs.

SUMMARY

The invention, in various embodiments, includes systems, methods, and devices that increase the speed of data transmissions while reducing the amount of processor power necessary for checking data integrity. According to one aspect, this is achieved through the use of an efficient technique ensuring data integrity without modifying the data. New data messages are compared to previous messages, and the number of differences is recorded in a diff-word. The diff-word is used by the receiver to verify complete reception of the new message. This method does not require the sender to ensure that the message meets standards of global consistency or to notify the receiver. Thus, it reduces the number of steps and/or messages necessary to check data integrity, increasing transmission speed and reducing the amount of processor power necessary for checking the data. According to further embodiments, the invention enables a communication protocol in which the receiver begins processing a message, before it has been completely received.

The invention, among other things, provides systems, methods, and devices for checking the integrity of data transmission. In one aspect, methods for transmitting data include comparing a new message with a buffered message representative of a previous message, recording an integer number of differences between the new message and the buffered message, generating a diff-word representative of the integer number of differences between the new message and the buffered message, appending the diff-word to the new message, and sending the new message with the diff-word to a receiver.

According to one feature, a new message has a plurality of n-bit words, and the buffered message has a plurality of n-bit words. In one configuration, the n-bit words of the new message are compared with the n-bit words represented by the buffered message, and the number of n-bit word differences is recorded in the diff-word.

According to another configuration, the diff-word is compared to a previous diff-word of the buffered message, and the diff-word is modified as a function of the comparison. In one feature, the diff-word is conditionally modified to achieve a selected characteristic of the diff-word as defined by a predetermined protocol. This may include, for example, altering a bit from the diff-word to achieve a selected characteristic for the diff-word. The selected characteristic may include, for example, a selected value of a selected bit in the diff-word, a selected parity characteristic of the diff-word, a selected sign of the diff-word, or any other suitable characteristic. The selected characteristic of the diff-word may be set to have a different value from the selected characteristic of a previous diff-word. According to one configuration, the receiver decodes the diff-word.

In another feature, a modify-word is appended to the new message, wherein the modify-word is representative of data generated to distinguish the new message from the previous message. According to a further feature, the modify-word is compared to a previous modify-word of the buffered message, and the modify-word is altered as a function of the comparison.

In yet another feature, the new message is copied to a transmitter message buffer, and may overwrite the buffered message currently stored in memory. In another feature, the new message is copied to a receiver message buffer, and may overwrite the buffered message currently stored in the receiver's memory. The receiver may also establish a predetermined protocol defining a message stored in a receiver buffer at a select time. In one configuration, the buffered message that the transmitter uses to calculate the number of differences between a previous message and the new message is the same as the buffered message that the receiver will use to calculate the number of differences between a previous message and the new message. The buffered message representative of the previous message may be not be equal to the previous message, and may be generated as a function of the previous message.

According to one feature, the receiver processes the diff-word sent by the transmitter, and as a function of the value of the diff-word, determines whether to process the new message. When the diff-word equals zero, the new message may be equal to the previous message. According to one implementation, wherein the diff-word equals zero, the receiver does not process the new message. The receiver may instead process the buffered copy representative of the previous message.

In another feature, the new message has a length, and a length-word is generated that is representative of the length of the new message. The length-word may be appended to the new message, along with the diff-word, for transmission. A new message may have a length that is different from the length of a previous message.

According to one aspect, methods for receiving data include comparing the new message to a buffered copy of a previous message, recording the integer number of differences between the previous message represented by the buffered copy and the new message, comparing the recorded integer number of differences with the diff-word sent by the sender, and based on the comparison, choosing to accept the new message.

In one configuration, the methods include determining whether the recorded integer number of differences equals the diff-word and accepting the message as a function of the comparison. If the new message is accepted by the receiver, it may be copied from a temporary buffer to a twin buffer. According to one example, the new message is coped to the buffer storing the buffered message.

In another configuration, the receiver begins comparing the data of the new message to a buffered copy of a previous message and recording the integer number of differences between the buffered copy and the new message, before receiving all data of the new message.

According to a further configuration, the data of the new message are sent in a first sequence and received in a second sequence. The second sequence may be different from the first sequence.

In a further configuration in which the sender transmits a length-word representative of a length of the new message, the methods at the receiver further include the step of determining whether the length-word is greater than a maximum allowable message length and, as a function of the comparison, delaying processing the new message until another length-word is received. The maximum allowable message length may be the maximum length of the buffered message.

According to the feature in which the sender transmits a modify-word, the receiver may compare the modify-word of the new message with the previous modify word of the buffered copy of a previous message. Based on this comparison, and on the comparison of the diff-word with the calculated number of differences between the new message and a buffered message, the new message may be accepted.

According to another aspect, the transmission of data may include comparing a new message with a buffered message representative of a previous message, recording an integer number of differences between the new message and the buffered message, generating a diff-word representative of the integer number of differences between the new message and the buffered message, determining whether there are differences between the new message and the buffered message, and determining whether to send the new message as a function of the comparison. According to one configuration, if there are no differences between the new message and the buffered message, the transmitter does not send the new message.

According to a further aspect, the transmission of data includes dividing a new message into a plurality of new segments, comparing the plurality of new segments with a buffered plurality of segments representative of a previous message, for a new segment, recording an integer number of differences between the new segment and a corresponding buffered segment of the previous message, generating a diff-word representative of the recorded integer number of differences, appending the diff-word to the new segment of the new message, and sending the new segment of the new message with the diff-word to a receiver. The segments may be transmitted in any order, and may be transmitted sequentially. The segments may also be received in any order by the receiver. According to one feature, a first segment includes a length-word representative of the length of the new message.

In one aspect, a transmitter memory twin buffer is employed for storing a buffered message representative of a previous message. Also, an encoder is employed for i) comparing a new message with the buffered message, ii) recording an integer number of differences between the new message and the buffered message, iii) generating a diff-word representative of the integer number of differences, and iv) appending the diff-word to the new message. A transmitter may also be employed for sending the new message with the diff-word to a receiver.

In one configuration, the invention employs a twin buffer at the receiver for storing a buffered copy representative of the previous message received. A decoder may also be employed for i) comparing the new message with the buffered copy and recording the integer number of differences between the new message and the previous message represented by the buffered copy, ii) comparing the recorded integer number of differences with the diff-word sent by the transmitter, and iii) choosing to accept the new message based on the comparison.

BRIEF DESCRIPTION OF THE DRAWINGS

The foregoing and other objects and advantages of the invention will be appreciated more fully from the following further description thereof, with reference to the accompanying drawings wherein.

DETAILED DESCRIPTION OF THE DRAWINGS

To provide an overall understanding of the invention, certain illustrative embodiments will now be described, including a system for checking the integrity of a data transmission between or within one or more digital processing systems by identifying the number of expected differences between a new message and a previous message, and conditionally sending or accepting a new message as a function of this difference. However, it will be understood by one of ordinary skill in the art that the systems, methods, and devices described herein can be adapted and modified for other suitable applications and that such other additions and modifications will not depart from the scope hereof.

In one embodiment, the invention provides data transmission systems that process a data message that is to be sent to a receiving device. The data transmission system processes the message by analyzing the data being sent. It identifies the number of differences between a new message and a buffered message representative of a previous message. The data transmission system creates a diff-word to record the number of differences, and appends the diff-word to the new message. After transmission the receiver can check whether the data transmission was successful by calculating the number of differences between the new message and a buffered message representative of the previous message, and comparing this difference to the diff-word.

In another embodiment, the invention provides processes for checking the integrity of data transmissions between or within two or more computers. The processes provide methods for encoding data to add information about the number of differences between a new message and a previous message. Additionally, methods are provided for creating a diff-word, which records the number of differences between a new message and a buffered message representative of a previous message. After data transmission, the processes provide methods for checking the integrity of the received message by comparing the diff-word with the calculated number of differences between the received message and a buffered message representative of a previous message.

Figure 1A:
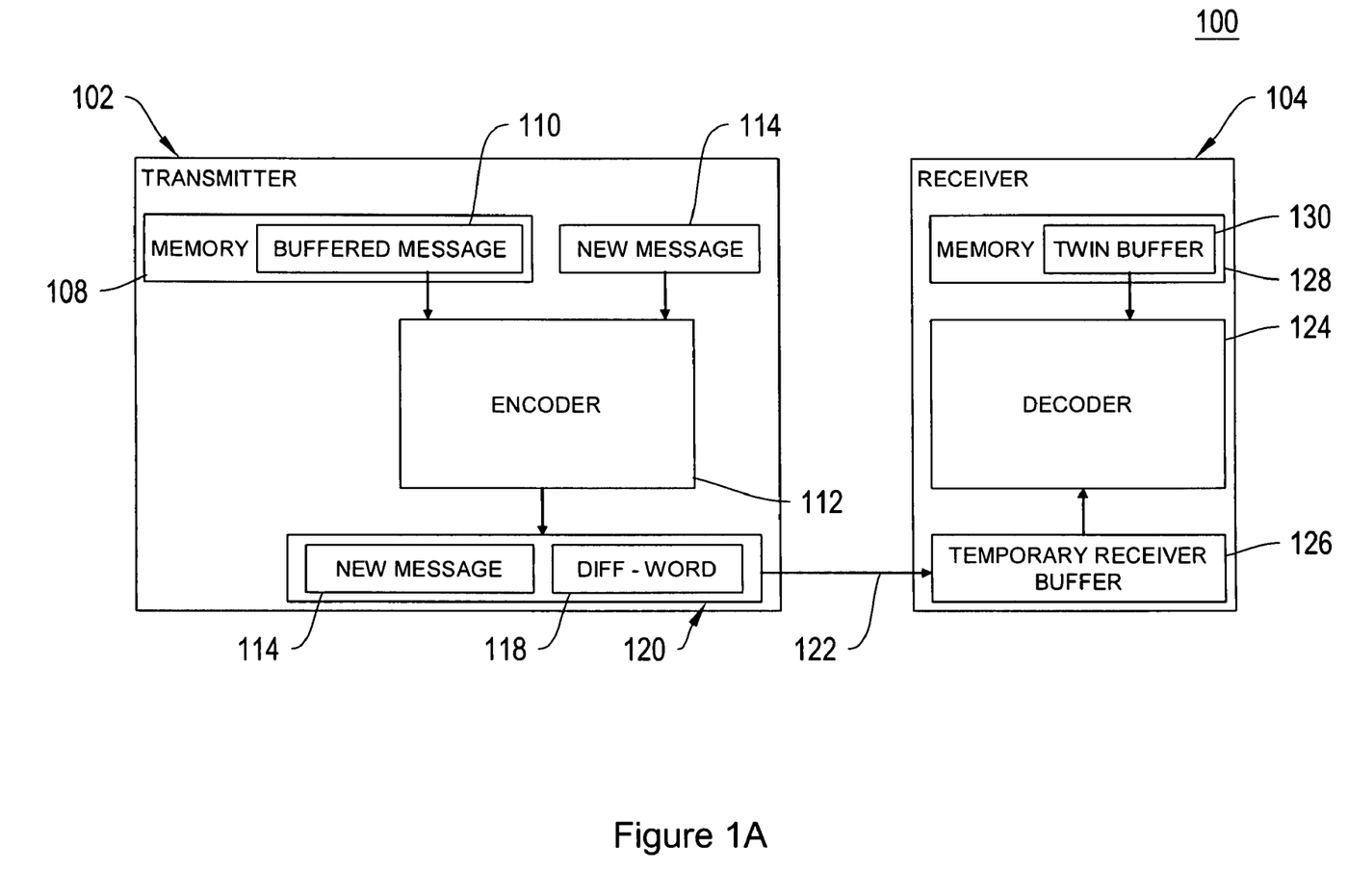
FIG. 1A shows a block diagram of a system for data transmissions.

FIG. 1A depicts a functional block diagram of a system 100 for checking integrity of data transmissions, according to an illustrative embodiment of the invention. FIG. 1A shows a transmitter 102 and a receiver 104. The transmitter 102 includes a memory 108 for storing a buffered message 110, and an encoder 112 for comparing the buffered message 110 with a new message 114. According to one embodiment, the buffered message 110 represents a previous message transmitted by the transmitter 102. As described in further detail with respect to FIG. 2, the encoder 112 calculates a diff-word 118, and appends the diff-word 118 to the new message 114, resulting in a transmit-message 120, which may be transmitted over a communications channel 122.

The transmit-message 120 is received by a receiver 104 which includes a temporary receiver buffer 126, a decoder 124 and a memory 128 with twin buffer 130 for storing a message. According to one embodiment, the temporary receiver buffer 126 holds a new message when it arrives, before the receiver 104 has determined whether to accept the new message. According to one embodiment, the twin buffer 130 stores a previous message accepted by the receiver 104. The decoder 124 decodes the transmit-message 120, as described in further detail with respect to FIG. 3, and the receiver 104 accepts the transmit-message 120 as a function of the comparison.

In one embodiment, the transmitter 102 may be a data processing system, such as a conventional data processing platform such as an IBM PC-compatible computer running the Windows operating systems, or a Sun workstation running a Unix operating system. Alternatively, the transmitter 102 may comprise a dedicated processing system that includes an embedded programmable data processing system that can include the encoder 112. For example, the transmitter 102 may be a data processing system that can comprise a single board computer system that has been integrated into a system for performing data encoding and transmission. In an alternative embodiment, the transmitter 102 may also comprise a single board computer (SBC) system that can be any suitable SBC, including the SBCs sold by the Micro/Sys Company, which include microprocessors, data memory and program memory, as well as expandable bus configurations and an on-board operating system. According to a further embodiment, the transmitter 102 may be a dedicated hardware component, such as a dedicated server.

According to one embodiment, the receiver 104 may also be a data processing system, such as a conventional data processing platform such as an IBM PC-compatible computer running the Windows operating systems, or a Sun workstation running a Unix operating system. Alternatively, the receiver 104 may comprise a dedicated processing system that includes an embedded programmable data processing system that can include the decoder 124. For example, the receiver 104 may be a data processing system that can comprise a single board computer system that has been integrated into a system for performing data reception and decoding. In an alternative embodiment, the receiver 104 may also comprise a single board computer (SBC) system that can be any suitable SBC, including the SBCs sold by the Micro/Sys Company, which include microprocessors, data memory and program memory, as well as expandable bus configurations and an on-board operating system. According to a further embodiment, the receiver 104 may be a dedicated hardware component, such as a dedicated server.

According to another embodiment, the transmitter 102 and/or receiver 104 can be realized as a software component operating on a conventional data processing system such as a Unix workstation. In that embodiment, the transmitter 102 and/or receiver 104 can be implemented as a C language computer program, or a computer program written in any high level language including C++, Fortran, Java or basic. Additionally, in an embodiment where microcontrollers or DSPs are employed, the transmitter 102 and/or receiver 104 can be realized as a computer program written in microcode or written in a high level language and compiled down to microcode that can be executed on the platform employed. The development of such transmission systems is known to those of skill in the art. Additionally, general techniques for high level programming are known, and set forth in, for example, Stephen G. Kochan, Programming in C, Hayden Publishing (1983). Developing code for the DSP and microcontroller systems follows from principles well known in the art.

Accordingly, although FIG. 1A graphically depicts the data transmitter 102 and the data receiver 104 as functional block elements, it will be apparent to one of ordinary skill in the art that these elements can be realized as computer programs or portions of computer programs that are capable of running on a data processor platform and to thereby configure a data processor as a system according to the invention.

The encoder 112 is a part of the transmitter 102, and may be implemented in a similar manner to those described above, or it may be coded as software or firmware. The encoder 112 processes the new message 114, calculates the number of differences between the new message 114 and the buffered message 110, and records the number of differences in a diff-word 120. The encoder 112 additionally appends the diff-word 118 to the new message 114 for transmission. According to one embodiment, "append" includes prepending, inserting, attaching or otherwise including the diff-word 118 with the new message 114 for transmission.

In another embodiment, the decoder 124 is a part of the receiver 104, and may be implemented in a similar manner to those described above, or it may be coded as software or firmware. The decoder 124 processes the received transmission in the temporary receiver buffer 126, segmenting the diff-word 118 from the new message 114. The decoder 124 calculates the number of differences between the new message 114 and the message stored in the twin buffer 130, and compares this difference to the diff-word 118. The decoder 124 decides whether to accept the new message 114 based on whether the number of differences equals the diff-word 118. If the decoder 124 rejects the new message 114, the receiver 104 may contact the transmitter 102 to relay that data has been lost in transmission, and request retransmission of the message.

The memory 108 includes an allocated buffer for storing the buffered message 110. The memory 108 may also include a buffer for storing the new message 114. The buffered message 110 represents a previous message send by the transmitter 102. The buffered message 110 may be a copy of the previous message, or it may be generated as a function of the previous message. According to one feature, the transmitter 102 includes a predetermined protocol defining the message stored in the twin buffer 130 in the memory 128 of the receiver 104. The transmitter 102 may use the predetermined protocol to ensure that the buffered message 110 equals the message stored in the receiver's twin buffer 130.

The communications channel 122 is a pathway over which information can be conveyed. Data may be transmitted using any number of technologies, including physical wires such as wire cables or optical fiber, or it may be wireless, such as radio-link, laser, radio, infra-red light, or other radiated energy source. The information has a source, from which it originates, and a destination, or receiver, to which it is delivered.

Figure 1B:
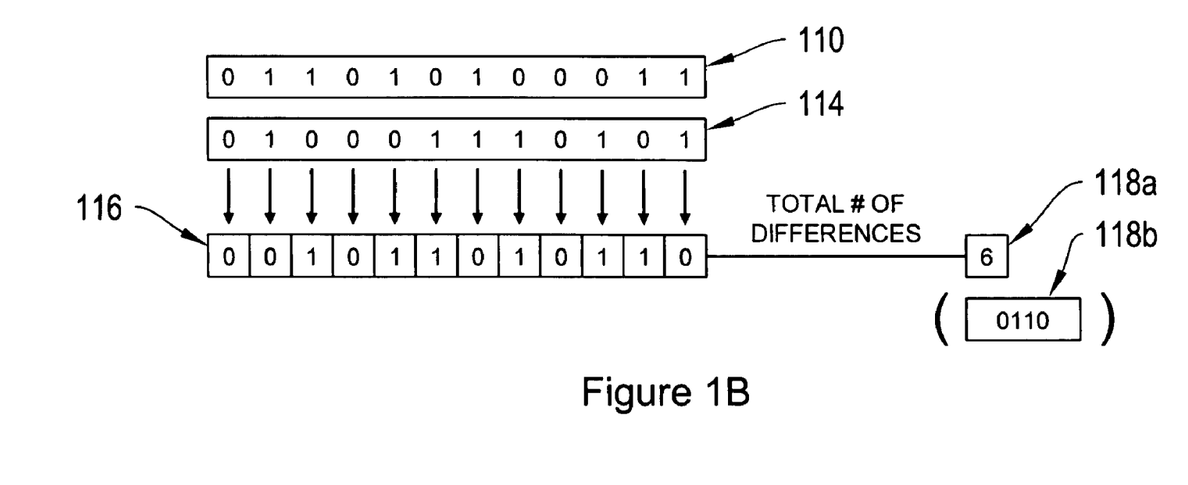
FIG. 1B shows a block diagram of the calculation of a diff-word.

FIG. 1B shows a block diagram of the calculation of a diff-word, according to an illustrative embodiment of the invention. As shown in FIG. 1B, the buffered message 110 is compared to the new message 114, resulting differences 116. In the illustrative embodiment, the number of differences 116 are added, resulting in an integer number of differences 118a. The number of differences may also be represented by a binary number 118b. According to one embodiment, a bit of the diff-word 118b may be modified to achieve a selected characteristic, as described below with respect to FIG. 2.

Figure 1C:
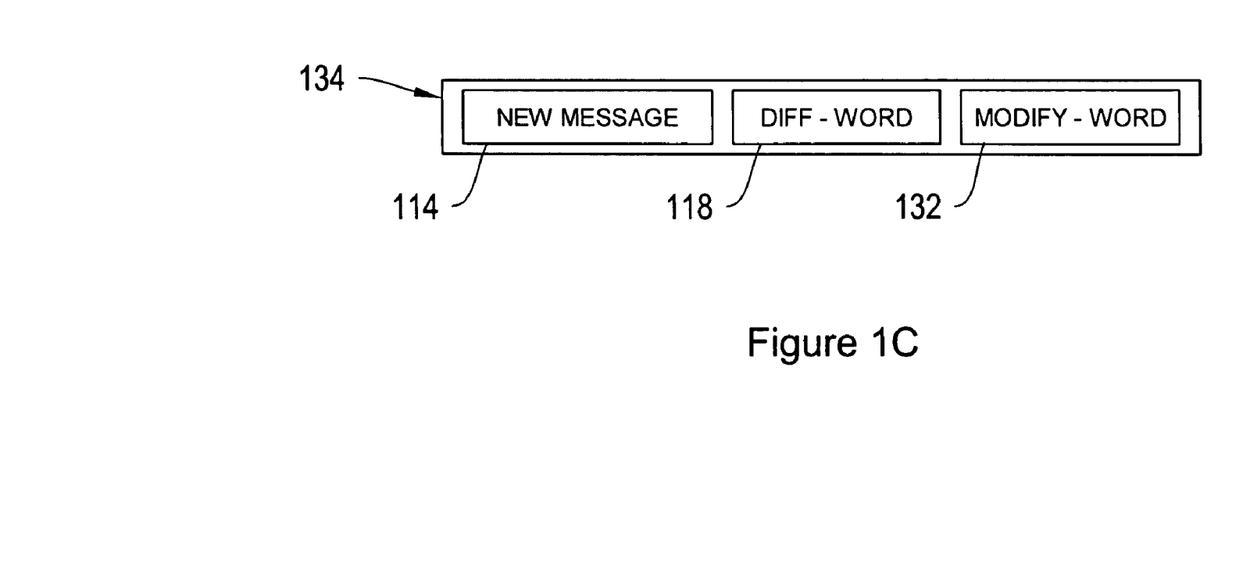
FIG. 1C shows a transmit-message including a modify-word.

FIG. 1C shows a transmit-message 134 including a modify-word 132, according to an illustrative embodiment of the invention. The modify-word represents data generated by the encoder 112 to distinguish the transmit-message 120 from a previous message. The modify-word may be any generated data, and preferably, the modify-word of a previous message will be different from the modify-word of a new message. The transmitter 102 appends the modify-word to the new message 114, as shown in FIG. 1C. Thus, if a transmit-message 120 of FIG. 1A is identical to a previously-transmitted transmit-message, appendage of a modify-word 132, as shown in FIG. 1C, enables the receiver 104 to detect the new transmit-message 134 and distinguish the new transmit-message 134 from a previously-transmitted transmit-message.

Figure 2:
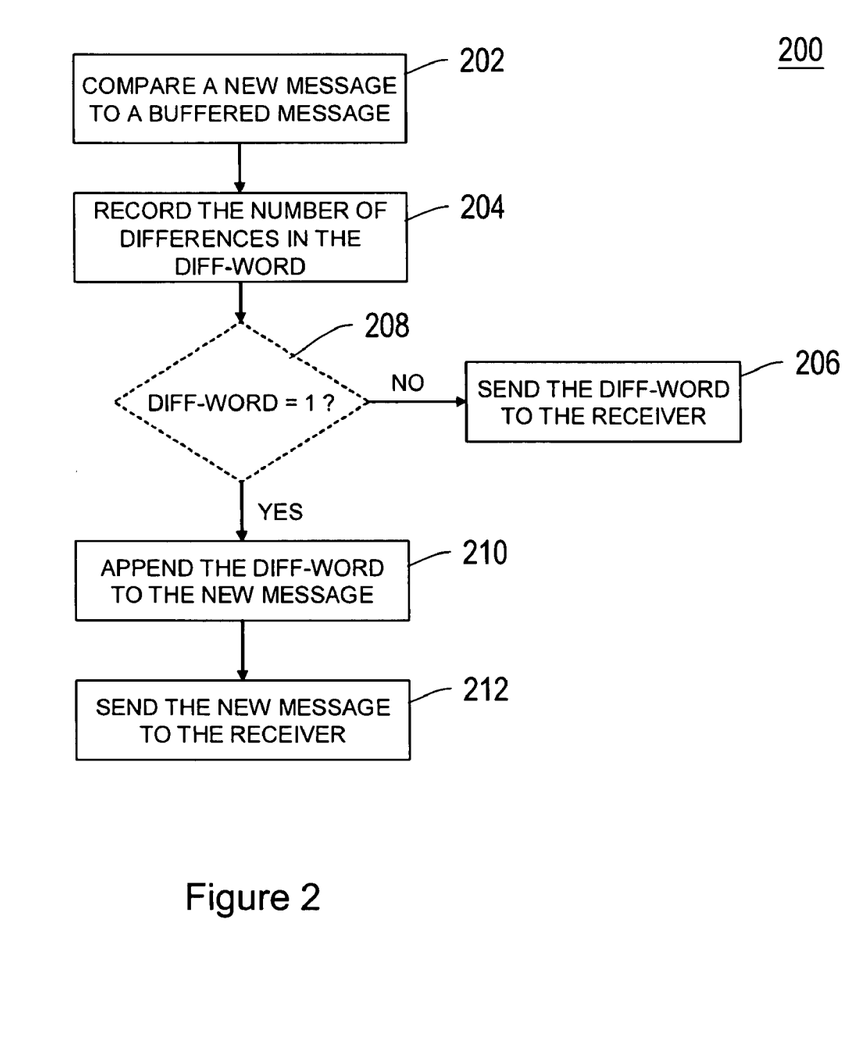
FIG. 2 shows a flow chart diagram of a method by which a data transmitter encodes a message.

FIG. 2 depicts a flow chart diagram of a method 200 by which a transmitter 102 encodes a message 114 for transmission to a receiver 104, according to an illustrative embodiment of the invention. The method 200 includes a new message 114, which may be an email, a media stream, or any other form of electronic communication, and is comprised of a stream of bits. At step 202, a transmitter 102 compares the new message 114 to a buffered message 110, which may represent a previously transmitted message. An encoder 112 of the transmitter 102 calculates the number of differences between the new message 114 and the buffered message 110, and records the number of differences in the diff-word 118 (step 204), as illustrated in FIG. 1B.

According to one embodiment, the encoder 112 conditionally modifies the diff-word 118 to achieve a selected characteristic. In one embodiment, the diff-word 118 may be modified by altering a bit from the diff-word 118 to achieve a selected value of the bit. For example, a selected bit of a diff-word 118 may be modified, such that the selected bit has a value opposite to the value of a selected bit of the previously-transmitted diff-word 118. In another embodiment, a diff-word 118 may be modified by altering a bit from the diff-word 118 to achieve a selected parity characteristic for the diff-word 118. For example, a selected bit from the diff-word 118 may be conditionally altered such that the diff-word 118 has an even parity, or such that the diff-word 118 has a parity that is opposite from the parity of the previously-transmitted diff-word. According to a further embodiment the diff-word 118 is interpreted as having a sign, and the diff-word 118 may be modified by altering the sign to achieve a selected sign of the diff-word 118. For example, the diff-word 118 may be conditionally altered such that the sign of the diff-word 118 is positive, or such that the sign of the diff-word 118 is opposite from the sign of a previously-transmitted diff-word.

Optionally, in step 208, the encoder 112 determines whether the diff-word 118 is greater than one (i.e., if there is a difference between the new message 114 and the buffered message 110) and proceeds to step 206 or step 210 as a function of the comparison. According to one embodiment, the transmitter 102 proceeds to step 210 if the diff-word is greater than or equal to one. At step 210, the transmitter 102 appends the diff-word 118 to the new message 114, creating a transmit-message 120. Alternatively, if the diff-word is zero, the transmitter 102 might decide to optionally only send the diff-word (step 206), since the body of the message is equal that of the temporary receiver buffer 126.

According to one embodiment, the encoder 112 generates a modify-word 132, as described above with respect to FIG. 1C. The transmitter 102 appends the modify-word to the new message 114, resulting in a transmit-message 134. If a transmit-message 120 of FIG. 1A is otherwise identical to a previously-transmitted transmit-message, appendage of the modify-word 132 enables the receiver 104 to detect the new transmit-message 134.

According to a further embodiment, the new message 114 has a length, and the encoder 112 generates a length-word, representing the length of the new message 114. The encoder 112 appends the length-word to the transmit-message 120 for transmission. According to one feature, the length-word of the new message 114 is different from the length-word of a previous message. According to another feature, the diff-word 118 includes the calculated differences between the length-word and a previous length-word.

In step 212 of FIG. 2, the transmitter 102 sends the transmit-message 120 to the receiver 104 over a communication line 122. According to one feature, upon transmission of a transmit-message 120, the new message 114 may be copied to the memory 108, replacing the current buffered message 110. According to another feature, upon transmission of a transmit-message 120, the buffered message 110 is replaced with a new buffered message generated as a function of the new message 114.

Figure 3:
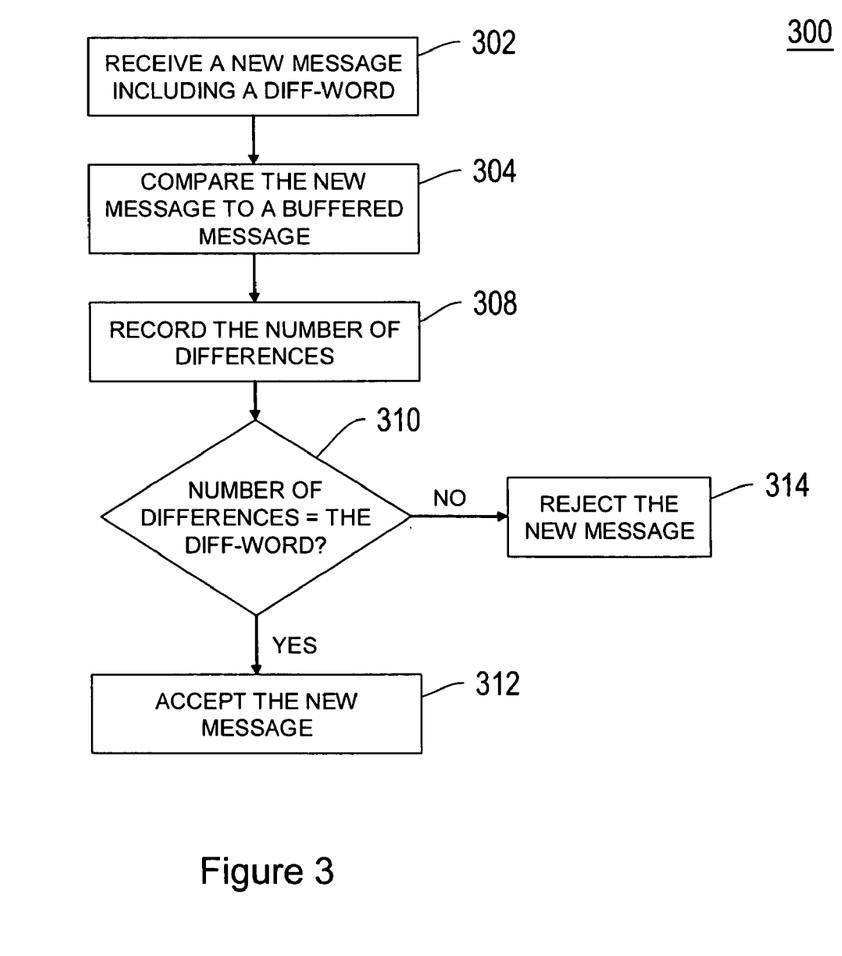
FIG. 3 shows a flow chart diagram of a method by which a receiver decodes a message.

FIG. 3 shows a flow chart diagram of a method 300 by which a receiver 104 decodes a transmit-message 120. The receiver 104 receives a transmit-message 120, including the new message 114 and a diff-word 118, and optionally a modify-word and/or length-word, in the temporary receiver buffer 126. The decoder 124 compares the new message 114 to data stored in a twin buffer 130, wherein the data is representative of a previously received message (step 304), and records the number of differences (step 308). The receiver 104 compares the number of differences to the diff-word 118 (step 310), and accepts the message as a function of the comparison. According to the illustrative example, if the number of differences equals the diff-word 118, the receiver 104 accepts the new message 114 (step 312), while if the number of differences does not equal the diff-word 118, the receiver 104 does not accept the new message 114 (step 314). According to another example, if the diff-word 118 equals zero, there are no differences and the receiver 104 therefore does not calculate the number of differences or compare the number of differences to the diff-word 118. According to this example, the receiver may suppress copying the message body to its twin buffer 130, since the content of the twin buffer 130 equals that of the temporary receiver buffer 126.

According to one embodiment, when a new message 114 first arrives at the receiver 104, the receiver 104 stores the new message 114 in a temporary buffer 126. According to one implementation, if the receiver 104 accepts the new message 114, the receiver 104 copies the new message 114 to the twin buffer 130. According to another embodiment, the receiver 104 begins processing a new message 114 before the entire new message 114 has been received.

According to a further embodiment, in which the transmitter 102 sends a length-word representative of the length of the new message 114, the receiver 104 compares the length-word to a predetermined maximum allowable message length. According to one feature, the predetermined maximum allowable message length as stored by the receiver 104 is less than or equal to the maximum possible length of the twin buffer 130. If the received length-word represents a length that is longer than the predetermined maximum allowable message length, the receiver 104 may determine that the correct length-word has not yet been received, and may delay processing the new message 114 until an allowable length-word is received.

In another embodiment, if the length-word sent by the transmitter 102 is not received by the receiver 104, the receiver 104 may process a previously received length-word with respect to the new message 114. The previously received length-word may represent a message length that is shorter or longer than the current new message 114.

According to this embodiment, if the length value is shorter than the length of the new message 114, the receiver may process only a first portion of the new message 114. The receiver may calculate the number of differences between the respective length-words and between only the first portion of the new message 114 and the corresponding portion of the twin buffer 130. According to this embodiment, the value of the diff-word of the new message is at least one, since the length-word of the new message is different from the corresponding value of a previous length-word. The second, unprocessed portion of the new message 114 may include data that is equal to the corresponding data of the twin buffer 130, and it may include data that is different from the corresponding data of the twin buffer 130. The unprocessed data that is equal to the corresponding data of the twin buffer 130 will not increase the diff-count as calculated by the receiver, since the correct data is already stored in the twin buffer 130. The unprocessed data that is not equal to the corresponding data of the twin buffer 130 may have increased the calculated number of differences between the new message 114 and the buffered message. Thus, according to one embodiment, the calculated number of differences is less that the correct number of differences appended by the transmitter and recorded in the diff-word, since the difference stemming from the length-word has not been included and because the receiver incorrectly compares too few words.

If the length value is longer than the length of the new message 114, the receiver 104 will calculate the number of differences between the new message 114 and the corresponding portion of the twin buffer 130, and will further calculate the number of differences between data in the temporary buffer 126 not included as part of the new message 114 and a further corresponding portion of the twin buffer 130. According to one embodiment, the data in the temporary buffer 126 that does not represent the new message 114, represents a previously received message, which, after having been accepted by the receiver 104, will have been copied to the twin buffer 130. Thus, according to one embodiment, the data in the temporary buffer 126 that does not represent the new message 114 must equal the corresponding data of the twin buffer 130, and this excess data will not increase the calculated number of differences between the new message 114 and the twin buffer 130. According to one example, in which the diff-word 118 includes the calculated differences between the length-word and a previous length-word, and the receiver 104 processes the previously received length-word in place of the newly transmitted length-word, the calculated number of differences will be less than the diff-word 118.

Figure 4:
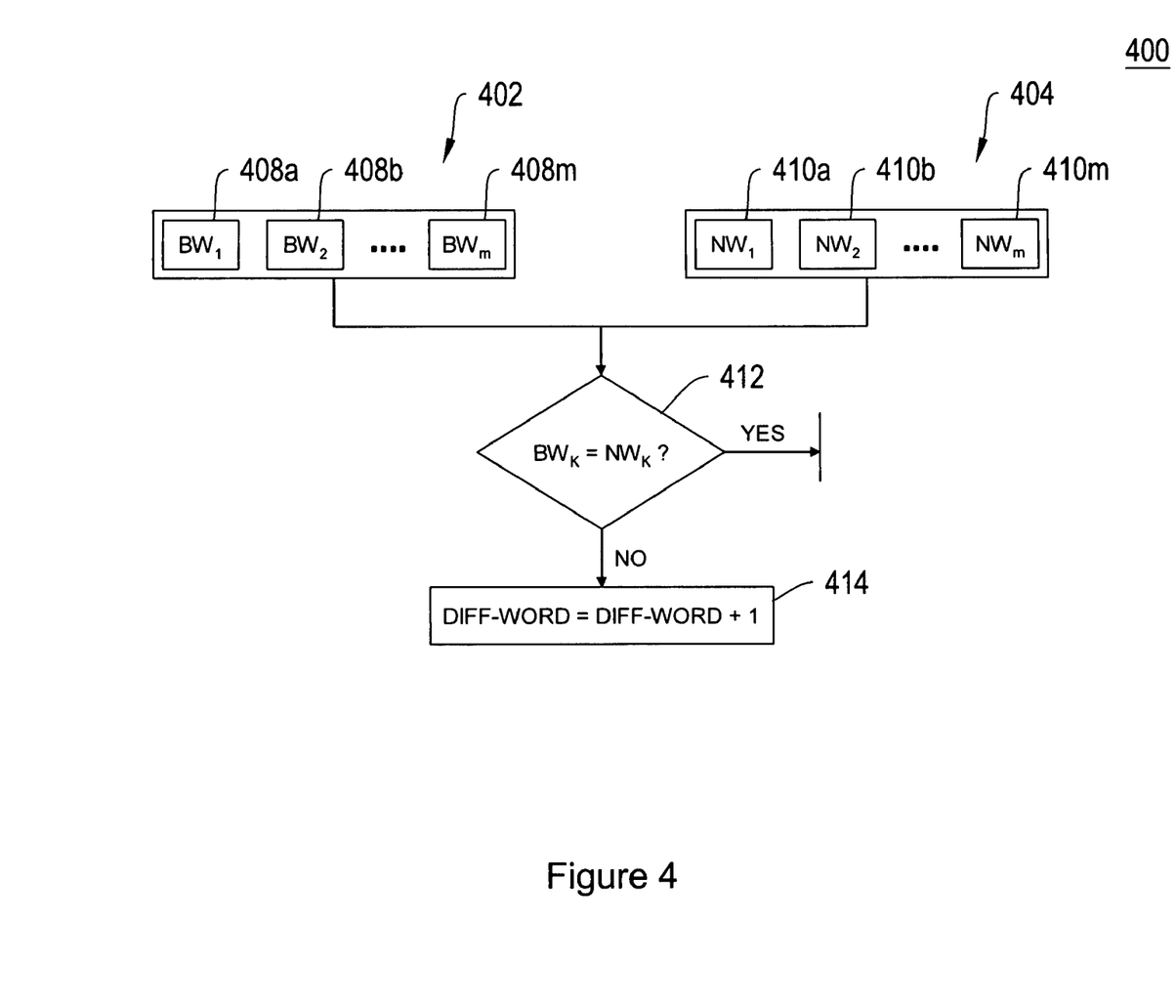
FIG. 4 shows a block diagram of a process for calculating the number of differences between a buffered message and a new message.

FIG. 4 shows a block diagram of a process 400 for calculating the number of differences between a buffered message 402 and a new message 404, according to an illustrative embodiment of the invention. The buffered message 402 includes a plurality of buffered words 408a, 408b, and 408m (generally "buffered words 408). The new message 404 includes a plurality of new words 410a, 410b, and 410m (generally "new words 410"). According to one embodiment, the number of buffered words 408 does not equal the number of new words 410. According to another embodiment, a message 402 or 404 only contains one word. An encoder, such as the encoder 112 of FIG. 1, compares each buffered word k with each corresponding new word k (412), and if the buffered word k is different from the corresponding new word k, the encoder increments the diff-word by 1 (414). If the buffered word k equals the corresponding new word k, and no differences are found, the encoder does not increment the diff-word. According to one implementation, the encoder repeats this process for each buffered word 408 and each corresponding new word 410.

According to one embodiment, the new words 410 of the new message 404 are also encoded, for example as described in U.S. patent application Ser. No. 11/256,752 entitled "Systems and Methods for Message Encoding and Decoding," the entirety of which is hereby incorporated by reference.

Figure 5:
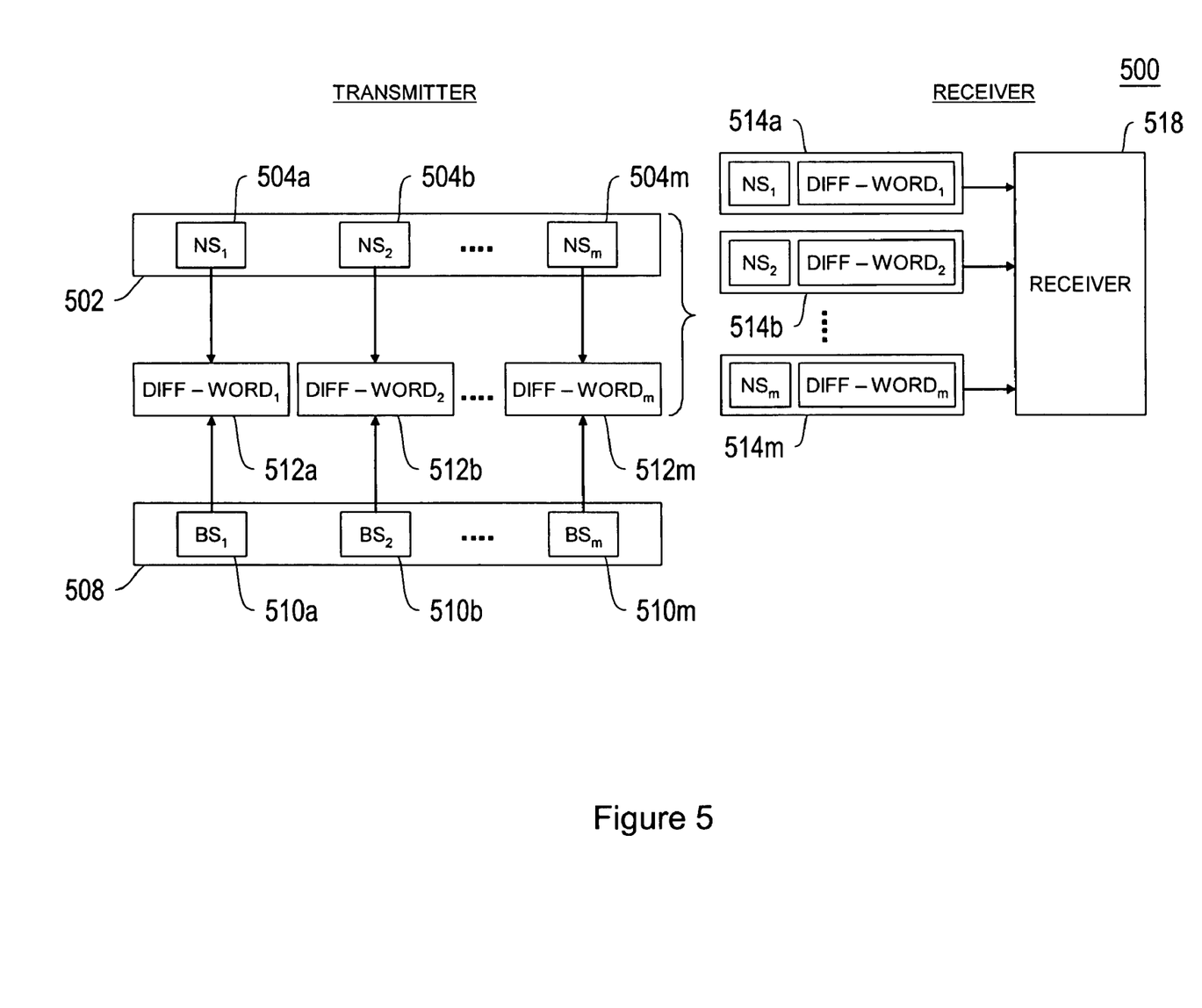
FIG. 5 shows a block diagram of a process for encoding and sending a message.

FIG. 5 shows a block diagram of a process 500 for encoding and sending a message 502, according to an illustrative embodiment of the invention. An encoder, such as the encoder 112 of FIG. 1, divides the new message 502 into a plurality of new segments 504a, 504b, and 504m (generally "new segments 504"). Similarly, the encoder divides a buffered message 508 into a plurality of buffered segments 510a, 510b, and 510m (generally "buffered segments 510"). The new segments 504 and the buffered segments 510 may have varying lengths. However, according to one feature, the length of a new segment k is equal to the length of a corresponding buffered segment k. According to one embodiment, the new message 502 is shorter than the buffered message 508, and only a first portion of the buffered message is divided into segments, such that for each new segment k, there is a corresponding buffered segment k.

An encoder compares a first new segment 504a with a first buffered segment 510a, calculates the number of differences between the segments 504a and 510a, and records the number of differences in the diff-word 512a. The encoder appends the diff-word 512a to the first new segment 504a, creating a transmit-segment 514a. According to one embodiment, the diff-word 512a is modified to achieve a selected characteristic, and described above with respect to diff-word 118 of FIG. 1. A modify-word may additionally be appended to the transmit-segment 514a. A segment-length-word may also be appended to the transmit-segment 514a. A transmitter, such as the transmitter 502 of FIG. 1, transmits the transmit-segment 514a to the receiver 518. This process is repeated for the plurality of new segments 504, resulting in a corresponding plurality of transmit-segments 514. According to one embodiment, the transmit-segments 514 may be transmitted in any order. The transmit-segments 514 may be transmitted sequentially.

In another embodiment, the transmit-segments 514 may be transmitted in a first order and received by the receiver 518 in a second order. The receiver 518 processes each received transmit-segment 514 in the same manner described above with respect to the received transmit-message 120 of FIG. 1, as described above.

According to a further embodiment, a first new segment 504a includes a length-word, representative of the length of the new message 502. When the receiver 518 receives the first new segment 504a and the diff-count 512a equals the calculated number of differences, the receiver 518 may determine that the length-word is correct. If the new message 502 is divided into new segments 504 of equal length, the receiver 518 may use the length-word to determine the expected number of new segments 504.

Those skilled in the art will know or be able to ascertain using no more than routine experimentation, many equivalents to the embodiments and practices described herein. Accordingly, it will be understood that the invention is not to be limited to the embodiments disclosed herein, but is to be understood from the following claims, which are to be interpreted as broadly as allowed under the law.

We claim:

1. A method for transmitting data comprising the steps of:
    comparing a new message with a buffered message representative of a previous message using an encoder associated with a message transmitter;
    recording, with the encoder, an integer number of differences between the new message and the buffered message;
    generating a diff-word representative of the integer number of differences between the new message and the buffered message using the encoder, the diff-word comprising the integer number in digital bits therein;
    appending, with the encoder, the diff-word to the new message; and
    sending the new message with the diff-word from the transmitter to a receiver.

2. The method of claim 1, wherein the new message has a plurality of n-bit words, and the buffered message has a plurality of n-bit words.

3. The method of claim 2, wherein the n-bit words of the new message are compared with the n-bit words represented by the buffered message, and a number of n-bit word differences is recorded in the diff-word.

4. The method of claim 1, further comprising the step of comparing, with the encoder, the diff-word to a previous diff-word of the buffered message, and modifying the diff-word as a function of the comparison using the encoder.

5. The method of claim 1, further comprising the step of modifying at least one bit of the diff-word to achieve a selected characteristic of the diff-word.

6. The method of claim 5, wherein the diff-word has a sign, and modifying the diff-word includes altering at least one bit from the diff-word to achieve one of:
    a selected value of the at least one bit;
    a selected parity characteristic for the diff-word; and
    a selected sign of the diff-word.

7. The method of claim 1, further comprising the step of decoding the diff-word with the receiver.

8. The method of claim 1, further comprising the step of appending, with the encoder, to the new message a modify-word, representative of data generated to distinguish the new message from the previous message.

9. The method of claim 8, further comprising the step of comparing, with the encoder, the modify-word to a previous modify-word of the buffered message, and altering the modify-word as a function of the comparison using the encoder.

10. The method of claim 9, further comprising the steps of:
    comparing, at the receiver, the data of the new message to a buffered copy of a previous message;
    recording, at the receiver, a second integer number of differences between the buffered copy of the previous message and the new message;
    comparing, at the receiver, the second integer number of differences with the diff-word sent by the transmitter;
    comparing, at the receiver, the modify-word of the new message with the previous modify-word of the buffered copy of the previous message; and
    based on the comparisons, choosing, at the receiver, to accept the new message.

11. The method of claim 1, further comprising the step of copying the new message to a transmitter message buffer.

12. The method of claim 1, further comprising the step of establishing a predetermined protocol defining a message stored in a receiver buffer of the receiver at a selected time.

13. The method of claim 1, wherein the buffered message representative of the previous message is generated as a function of the previous message.

14. The method of claim 1, further comprising the steps of:
    processing, at the receiver, the diff-word; and
    determining whether to process the new message as a function of the value of the diff-word.

15. The method of claim 14, wherein the diff-word equals zero and the receiver processes a buffered copy representative of the previous message.

16. The method of claim 15, wherein the previous message is the same as the new message.

17. The method of claim 1, wherein the new message has a length, and further comprising generating a length-word representative of the length of the new message.

18. The method of claim 17, wherein the new message has a length that is different from the length of the previous message.

19. The method of claim 1, further comprising the steps of:
    comparing, at the receiver, the new message to a buffered copy of a
    previous message;
    recording, at the receiver, a second integer number of differences between the previous message represented by the buffered copy and the new message;
    comparing, at the receiver, the second integer number of differences with the diff-word sent by the transmitter; and
    based on the comparison, choosing, at the receiver, to accept the new message.

20. The method of claim 19, further comprising the step of determining whether the recorded integer number of differences equals the diff-word and accepting the new message as a function of the comparison.

21. The method of claim 19, further comprising the step of determining whether the new message is accepted by the receiver and copying the new message to a twin buffer as a function of the comparison.

22. The method of claim 19, wherein the receiver initiates comparing and recording before receiving all data of the new message.

23. The method of claim 19, wherein data of the new message are sent in a first sequence and received in a second sequence.

24. The method of claim 23, wherein the second sequence is different from the first sequence.

25. The method of claim 19, wherein accepting the new message comprises copying the new message to a twin buffer.

26. The method of claim 19, wherein the transmitter transmits a length-word representative of a length of the new message.

27. The method of claim 26, further comprising the step of determining whether the length-word is greater than a maximum allowable message length and, as a function of the comparison, delaying processing the new message until another length-word is received.

28. A method for transmitting data, comprising the steps of:
- comparing a new message with a buffered message representative of a previous message, using an encoder associated with a message transmitter,;
- recording, with the encoder, an integer number of differences between the new message and the buffered message;
- generating a diff-word representative of the integer number of differences between the new message and the buffered message using the encoder, the diff-word comprising the integer number in digital bits therein;
- determining, with the encoder, whether there are differences between the new message and the buffered message; and
- determining, with the encoder, whether to send the new message as a function of the comparison.

29. A method for transmitting data, comprising the steps of:
- dividing a new message into a plurality of new segments with an encoder associated with a message transmitter;
- comparing, with the encoder, the plurality of new segments with a buffered plurality of segments representative of a previous message;
- for a new segment, recording, with the encoder, an integer number of differences between the new segment and a corresponding buffered segment of the previous message;
- generating a diff-word representative of the recorded integer number of differences using the encoder, the diff-word comprising the integer number in digital bits therein;
- appending, with the encoder, the diff-word to the new segment of the new message; and
- sending the new segment of the new message with the diff-word from the transmitter to a receiver.

30. The method of claim 29, wherein a first segment includes a length-word representative of the length of the new message.

31. A system for transmitting data comprising:
- a transmitter memory for storing a buffered message representative of a previous message;
- an encoder for comparing a new message with the buffered message and recording an integer number of differences between the new message and the buffered message, generating a diff-word representative of the integer number of differences, the diff-word comprising the integer number in digital bits therein, and appending the diff-word to the new message; and
- a transmitter for sending the new message with the diff-word to a receiver.

32. The system of claim 31, further comprising at the receiver:
- a receiver memory for storing a buffered copy representative of the previous message; and
- a decoder for comparing the new message with the buffered copy and recording the integer number of differences between the new message and the previous message represented by the buffered copy, comparing the recorded integer number of differences with the diff-word sent by the transmitter, and based on the comparison, choosing to accept the new message.

* * * * *